United States Patent [19]

Shimbo

[11] Patent Number: 4,624,737
[45] Date of Patent: Nov. 25, 1986

[54] PROCESS FOR PRODUCING THIN-FILM TRANSISTOR

[75] Inventor: Masafumi Shimbo, Tokyo, Japan

[73] Assignee: Seiko Instruments & Electronics Ltd., Tokyo, Japan

[21] Appl. No.: 743,092

[22] Filed: Jun. 10, 1985

[30] Foreign Application Priority Data

Aug. 21, 1984 [JP] Japan .................................. 59-173848

[51] Int. Cl.⁴ ...................... H01L 21/306; B44C 1/22; C03C 15/00; C23F 1/02
[52] U.S. Cl. .................................. 156/643; 29/576 R; 29/578; 29/591; 156/652; 156/653; 156/656; 156/657; 156/659.1; 156/662; 156/667; 357/4; 357/23.1; 427/88; 427/93; 427/94
[58] Field of Search ............... 156/643, 646, 652, 653, 156/655, 656, 657, 659.1, 661.1, 662, 667, 668; 204/192 E, 192 EC; 427/38, 39, 88, 89, 90, 93, 94, 95; 430/313, 317, 318; 29/571, 576 R, 578, 591; 357/4, 23.1, 23.7, 65, 71

[56] References Cited

U.S. PATENT DOCUMENTS 4,331,758  5/1982  Luo .................................. 156/656 X
4,426,407  1/1984  Morin et al. .................... 156/656 X Primary Examiner—William A. Powell
Attorney, Agent, or Firm—Robert E. Burns; Emmanuel J. Lobato; Bruce L. Adams

[57] ABSTRACT

A gate insulating film, a high-resistivity semiconductor film, a low-resistivity semiconductor film and if necessary a conducting film are successively deposited in lamination without exposing them to any oxidizing atmosphere including atmospheric air, and then the source and drain electrodes are selectively formed.

4 Claims, 13 Drawing Figures

PROCESS FOR PRODUCING THIN-FILM TRANSISTOR

BACKGROUND OF THE INVENTION

This invention relates to a process for producing a thin-film transistor with improved performance.

Thin-film transistors (TFT) using semiconductor films of amorphous silicon (a-Si) or polycrystalline silicon (P-Si) are being applied to liquid crystal displays and like devices. Such thin-film transistors are diversified in structure. FIGS. 1a to 1d illustrate a conventional process for producing a thin-film transistor of a planar structure using amorphous silicon film. Shown in FIG. 1a in a sectional view is the initial step for selectively forming a gate electrode 2 on an insulating substrate 1 such as a glass substrate. Then, as shown in FIG. 1b, a gate insulating film 3 (such as silicon nitride film) and an amorphous silicon film 4 are continuously deposited, and said amorphous silicon film 4 is selectively etched. Then a field insulating film 7 (such as SiOx film) is deposited and windows for contact with source and drain regions are formed as shown in FIG. 1c. Although not shown, a gate contact window is also formed simultaneously. Thereafter, as illustrated in FIG. 1d, for instance n+ amorphous silicon films 25, 26 and metal (such as Al) films 15, 16 are deposited and selectively etched to form drain and source electrodes 5, 6, thereby completing a thin-film transistor unit. If necessary, a surface passivation film and/or light-shielding film are further formed thereon.

In the conventional process shown in FIGS. 1a to 1d, since the masking step precedes the deposition of n+ amorphous films 25, 26, natural oxide is produced on the exposed surface of amorphous silicon film 4. Although such natural oxide can be removed by an aqueous solution of hydrofluoric acid (HF) or a similar substance, the possibility is still great that oxygen and its compounds as well as other impurities can collect on the laminate surface as it is exposed to the atmosphere. This would give rise to electrical resistance between the source and drain and between channels in the thin-film transistor thus obtained, making such transistor unable to exhibit its desired characteristics. A similar phenomenon would also occur at the interface of n+ amorphous silicon films 25, 26 and metal films 15, 16.

As described above, according to the conventional process, resistance would be generated between the source and drain and between channels and it was thus impossible to obtain the proper current flow and frequency characteristics. It was also a disadvantage of such conventional process that it was necessary to repeat the masking step as many as 5 to 6 times.

SUMMARY OF THE INVENTION

It is an object of present invention to provide a simplified process for producing a thin-film transistor with an improved contact arrangement.

DETAILED DESCRIPTION OF PREFERRED EMBODIMENTS

The present invention will be described in detail below with reference to the accompanying drawings.

Figure 1A:
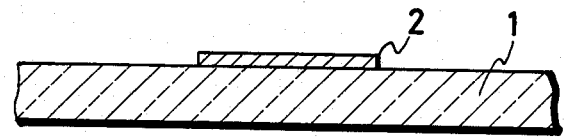
FIGS. 1a to 1d are sectional views showing the sequential steps in a conventional thin-film transistor production process.
Figure 1B:
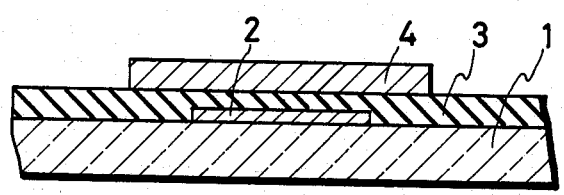
Figure 1C:
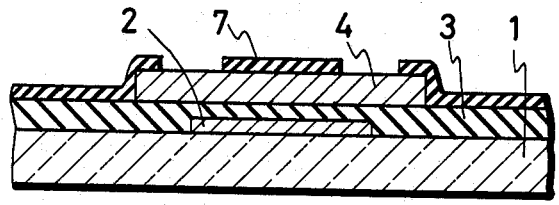
Figure 1D:
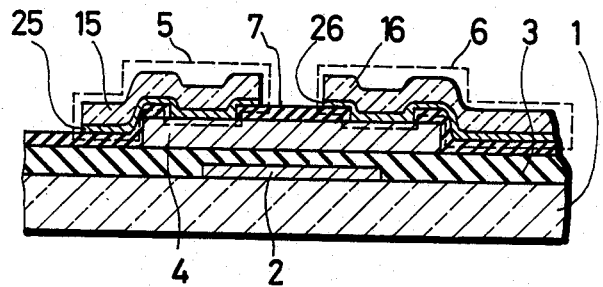
Figure 2A:
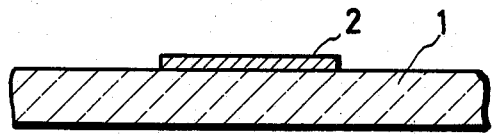
FIGS. 2a to 2e are sectional views illustrating stepwise a process for producing a thin-film transistor according to the present invention.

FIGS. 2a to 2e are sectional views illustrating a process for producing a thin-film transistor using amorphous silicon according to this invention. FIG. 2a shows in a sectional view the initial step for selectively forming a gate electrode 2 on an insulating substrate 1 such as glass, quartz, ceramic, insulator-coated silicon or metal. Metals such as Cr, Mo, W, Al, Ta, etc., and their silicides, impurity-doped polysilicon and other like materials can be used as said gate electrode 2.

Figure 2B:
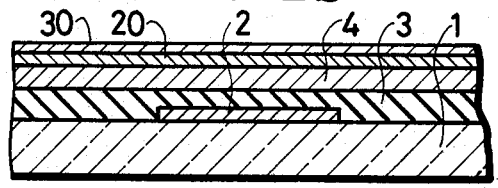

In the next step illustrated in FIG. 2b in a sectional view, a gate insulating film 3, a high-resistivity film 4, a low-resistivity a-Si:H (usually hydrogenated amorphous silicon) film 20 and a conducting film 30 made of a metal or other material are successively formed on said gate electrode 2 and substrate 1 without exposing them to an oxidizing atmosphere. Such successive deposition can be accomplished, for instance, by forming a silicon nitride (SiNx) film as gate insulating film 3 from a mixed gas of $SiH_4$ and $NH_3$, forming a high-resistivity a-Si:H film 4 by using $SiH_4$ and forming a n+ a-Si:H film 20 from a mixed gas of $PH_3$ and $SiH_4$ in the same evacuated chamber in a plasma CVD apparatus. It is also possible to form said films successively in the respective chambers by using a plasma CVD apparatus having in-line chambers. Further, when a sputtering or metalizing chamber is additionally provided, conducting film 30 can be also deposited continuously without exposure to the atmosphere. Beside SiNx, a film of SiOx or a multi-layer film made of such materials can be used as said gate insulating film 3. In place of said high-resistivity amorphous silicon film 4, there can be used a film of amorphous silicon-fluorine alloy (a-Si:F) or amorphous silicon-hydrogen-fluorine alloy (a-Si:H:F) using, for instance, $SiF_4$, or a microcrystalline amorphous silicon film. Such alloys can be also used for said low-resistivity amorphous silicon film 20, and such film may contain other impurites beside phosphorous impurities. As said conducting film 30, it is desirable to use a stable conducting film such as a transparent conducting film made of a refractory metal such as Cr, W, Mo, Ta, etc., and silicides thereof, or indium-tin-oxide (ITO), $SnO_2$ and the like. Use of a transparent conducting film has the advantage that the process is simplified when the thin-film transistor of this invention is applied to an active matrix liquid crystal display.

Figure 2C:
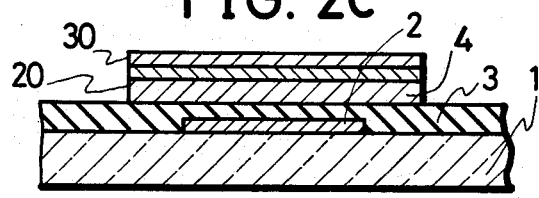
Figure 2D:
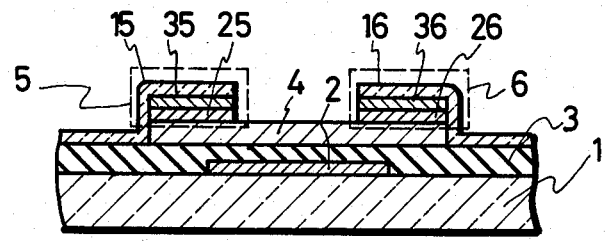

FIG. 2c illustrates the step in which said conducting film 30, low-resistivity amorphous silicon film 20 and high-resistivity amorphous silicon film 4 are left as an island region by etching in a single masking step. Known etching techniques such as wet etching, plasma etching, reactive ion etching, ion etching, etc., can be used for this step. Then, as illustrated in FIG. 2d in a sectional view, drain and source electrode members 15, 16 are selectively provided, and conducting film 30 and low-resistivity amorphous silicon film 20 shown in FIG. 2c are selectively removed with said electrode members 15, 16 serving at least as a part of the mask to form drain electrode 5 and source electrode 6. In this step, it is desirable to clean the surface of conducting film 30 by proper etching means such as sputter etching or ion etching before forming said drain and source electrode members 15, 16. In this case, the channel areas of the thin-film transistor are safe from damage by cleaning as they are covered with conducting film 30. The same materials as used for conducting film 30 and other materials such as Al can be used for said drain and source electrode members 15, 16. When selectively etching low-resistivity amorphous silicon film 20, no problem arises even if it is overetched to the extent that etching reaches the high-resistivity amorphous silicon film 4.

Figure 2E:
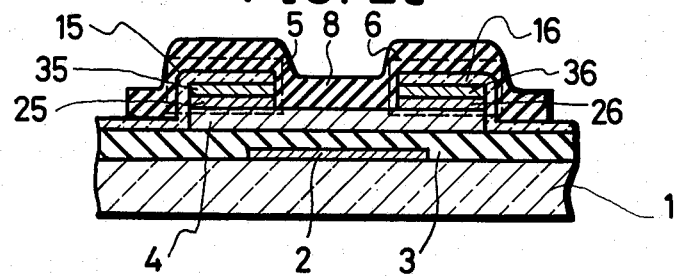

In the final step illustrated in FIG. 2e, a surface passivation film 8 is deposited, and the drain and source electrodes 15, 16 and gate electrode 2 are partly exposed (not shown). A CVD film of SiOx, SiNx, etc., a resist or a coating of polyimide resin can be used as said surface passivation film 8. If light shielding is required, a multilayer film composed of said insulating film and a metal or high-resistivity semiconductor film can be used as said surface passivation film 8. When amorphous silicon-germanium alloy ($a\text{-}Si_{1-x}Ge_x$) is used as light-shielding film, surface passivation may not be necessary.

Figure 3A:
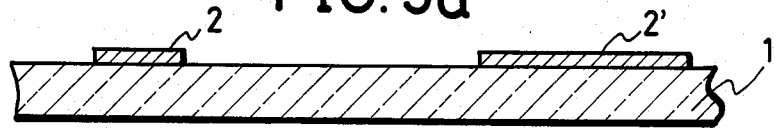
FIGS. 3a to 3d are sectional views illustrating the sequential steps for producing a thin-film transistor according to the process of this invention as it was applied to a substrate for liquid crystal display.
Figure 3B:
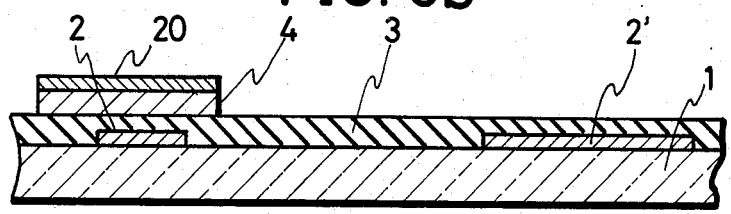

FIGS. 3a to 3d show sectionally a unit picture cell in an application of the present invention to the manufacture of a TFT substrate for liquid crystal display. FIG. 3a illustrates a step in which gate electrode 2 extending along one line and gate electrodes 2' on another line are formed on a transparent insulating substrate 1 such as glass substrate. Then, as illustrated in FIG. 3b, gate insulating film 3, high-resistivity amorphous silicon film 4 and low-resistivity amorphous silicon film 20 are deposited successively without exposure to an oxidizing atmosphere, and said low-resistivity amorphous silicon film 20 and high-resistivity amorphous silicon film 4 are left as an island region in the area where a thin-film transistor is to be formed.

Figure 3C:
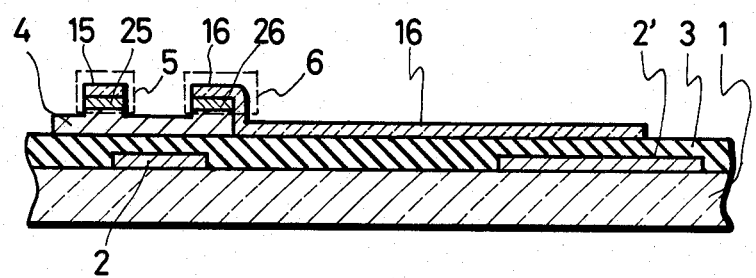
Figure 3D:
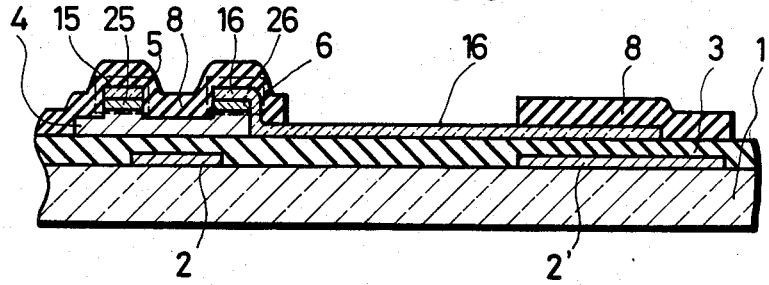

In the next step illustrated in FIG. 3c, a transparent conducting film such as ITO film is deposited; then, drain electrode 15 and source electrode 16 which doubles as a picture cell electrode are selectively formed and the exposed portion of low-resistivity amorphous silicon film 20 is removed. In this example, a charge-holding capacitor is formed by said picture cell electrode (source electrode) 16, gate electrode 2' and gate insulating film 3. In the final step shown sectionally in FIG. 3d, surface passivation film 8 concurrently serving as a light-shielding film is deposited and then selectively etched to expose picture cell electrode, drain electrode 15 and a part of gate electrodes 2, 2' (not shown). In this example, no conducting film is formed on low-resistivity amorphous silicon film 20, but a conducting film such as ITO film may be formed on said low-resistivity film 20 as in the example shown in FIG. 2.

As described above, according to the present invention, no oxides, etc., are formed at the interface of high-resistivity amorphous silicon film 4 and low-resistivity amorphous silicon film 20, so that a good junction can be formed. The same is true with the interface of low-resistivity amorphous silicon film 20 and conducting film 30. Further, since the interfaces of low-resistivity amorphous silicon film 20 or conducting film 30 and drain and source electrodes 15, 16 can be cleaned without damaging the high-resistivity amorphous silicon film, a good contact can be obtained without sacrificing the inherent properties of thin-film transistor.

According to the present invention, as explained above, a thin-film transistor having good contact characteristics can be formed with only four masking operations. The present invention is especially effective for the production of thin-film transistors requiring a low temperature process such as thin-film transistors using amorphous silicon. It is thus possible with the present invention to obtain a thin-film transistor with small channel series resistance which improves driving performance and frequency characteristics.

While the present invention has been principally described regarding an embodiment thereof as applied to the production of a thin-film transistor using amorphous silicon by utilizing plasma CVD, the invention can as well be applied to the manufacture of thin-film transistors using semiconductor films by utilizing the photo CVD or molecular beam and/or the ion beam deposition method, thin-film transistors using polysilicon, and thin-film transistors using semiconductor films of other materials than silicon; consequently, the present invention is of great industrial significance.

I claim:

1. A process for producing a thin-film transistor comprising a first step for forming a gate electrode on an insulating substrate, a second step for continuously depositing on said gate electrode and substrate a gate insulating film, a high-resistivity semiconductor film and a conducting film containing at least a low-resistivity semiconductor film without exposing them to an oxidizing atmosphere, a third step in which said high-resistivity semiconductor film and said conducting film are selectively etched so that they are partly left as an island region on said gate electrode, a fourth step for selectively forming a source electrode and a drain electrode both contacting a part of the surface of said island region and spaced apart from each other, a fifth step for selectively removing said conducting film exposed on said island region with said source and drain electrodes serving as at least a part of the mask, a sixth step for depositing a surface passivation film, and a seventh step for selectively removing said surface passivation film and exposing a part of each of said source electrode, drain electrode and gate electrode.

2. A process for producing a thin-film transistor according to claim 1, wherein in said second step said conducting film is composed of at least two layers consisting of a low-resistivity semiconductor film and thereon a refractory metal film or transparent conducting film, and both of said films are continuously deposited without being exposed to the oxidizing atmosphere.

3. A process for producing a thin-film transistor according to claim 1, wherein in said sixth step a light-shielding film is formed at a part of said surface passivation film.

4. A process for producing a thin-film transistor according to claim 2, wherein in said sixth step a light-shielding film is formed at a part of said surface passivation film.

* * * * *

United States Patent
(12) EX PARTE REEXAMINATION CERTIFICATE (10089th)

Shimbo

(10) Number: US 4,624,737 C1
(45) Certificate Issued: Apr. 2, 2014

(54) PROCESS FOR PRODUCING THIN-FILM TRANSISTOR

(75) Inventor: Masafumi Shimbo, Tokyo (JP)

(73) Assignee: LG Display Co., Ltd., Youngdungpo-Gu, Seoul (KR)

Reexamination Request:
No. 90/009,508, Jul. 27, 2009

Reexamination Certificate for:
Patent No.: 4,624,737
Issued: Nov. 25, 1986
Appl. No.: 06/743,092
Filed: Jun. 10, 1985

(30) Foreign Application Priority Data

Aug. 21, 1984 (JP) ..................... 59-173848

(51) Int. Cl.
*H01L 21/306* (2006.01)
*B44C 1/22* (2006.01)
*C03C 15/00* (2006.01)
*C23F 1/02* (2006.01)

(52) U.S. Cl.
USPC .............. 156/643; 29/576 R; 29/578; 29/562; 29/563; 29/656; 156/657; 156/659.2; 156/662; 156/667; 357/4; 357/23.1; 427/88; 427/93; 427/94

(58) Field of Classification Search
None
See application file for complete search history.

(56) References Cited

To view the complete listing of prior art documents cited during the proceeding for Reexamination Control Number 90/009,508, please refer to the USPTO's public Patent Application Information Retrieval (PAIR) system under the Display References tab.

*Primary Examiner* — Tuan H Nguyen

(57) ABSTRACT

A gate insulating film, a high-resistivity semiconductor film, a low-resistivity semiconductor film and if necessary a conducting film are successively deposited in lamination without exposing them to any oxidizing atmosphere including atmospheric air, and then the source and drain electrodes are selectively formed.

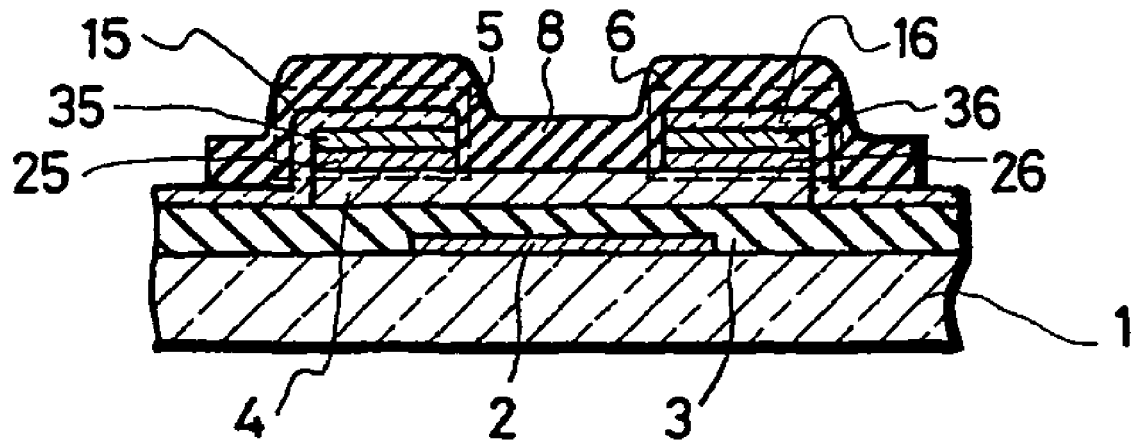

EX PARTE REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

Claim 1 is cancelled.

Claims 2-4 were not reexamined.

\* \* \* \* \*